United States Patent [19]
Sridharan et al.

[11] Patent Number: 5,998,037
[45] Date of Patent: Dec. 7, 1999

[54] PORCELAIN ENAMEL COMPOSITION FOR ELECTRONIC APPLICATIONS

[75] Inventors: Srinivasan Sridharan, Strongsville; William D. Faust, Aurora; Gordon J. Roberts, Parma, all of Ohio

[73] Assignee: Ferro Corporation, Cleveland, Ohio

[21] Appl. No.: 08/995,584

[22] Filed: Dec. 22, 1997

[51] Int. Cl.[6] .............................. B32B 9/00; C03C 3/066
[52] U.S. Cl. ......................... 428/472; 428/471; 501/78; 501/79; 501/18; 427/126.4; 427/458
[58] Field of Search ................... 501/14, 17, 18, 501/27, 53, 77, 135, 16, 78, 23, 79; 428/432, 469, 471, 689, 209, 210, 472; 427/458, 126.1, 126.2, 126.4, 126.5, 126.6, 535

[56] References Cited

U.S. PATENT DOCUMENTS

| | | | |
|---|---|---|---|
| 3,950,174 | 4/1976 | Suzuki et al. | 106/39.6 |
| 4,056,395 | 11/1977 | Sato et al. | 96/36 |
| 4,256,796 | 3/1981 | Hang et al. | 428/210 |
| 4,460,630 | 7/1984 | Nishino et al. | 427/376.2 |
| 4,732,794 | 3/1988 | Hyde | 428/210 |
| 4,746,533 | 5/1988 | Hubbard | 427/27 |
| 4,794,048 | 12/1988 | Oboodi et al. | 428/432 |
| 4,806,334 | 2/1989 | Fujinaka et al. | 428/631 |
| 4,892,847 | 1/1990 | Reinherz | 501/14 |
| 5,002,903 | 3/1991 | Lim et al. | 501/26 |
| 5,051,381 | 9/1991 | Ohji et al. | 501/26 |
| 5,093,285 | 3/1992 | Murkens | 501/17 |
| 5,369,062 | 11/1994 | Chiang et al. | 501/63 |
| 5,444,104 | 8/1995 | Waknine | 522/24 |
| 5,468,694 | 11/1995 | Taguchi et al. | 501/77 |
| 5,488,019 | 1/1996 | Abe et al. | 501/139 |
| 5,605,869 | 2/1997 | Mangat et al. | 501/14 |

*Primary Examiner*—Timothy Speer
*Assistant Examiner*—Stephen Stein
*Attorney, Agent, or Firm*—Rankin, Hill, Porter & Clark LLP

[57] ABSTRACT

The present invention provides a new and improved coating composition for use in forming a dielectric layer upon a section of metal upon firing. The coating composition includes a glass composition, said glass composition comprising in weight percent a combined weight of BaO and SrO of from about 15% to about 75%, from about 5% to about 35% $B_2O_3$, from about 10% to about 40% $SiO_2$, up to about 10% $Al_2O_3$, up to about 7% $Co_3O_4$, up to about 20% ZnO, up to about 20% $TiO_2$, up to about 7% $P_2O_5$, up to about 7% CuO, up to about 7% $Fe_2O_3$, up to about 7% NiO, a combined weight of SnO, $MoO_3$, $WO_3$, $Sb_2O_5$, of up to about 20%, up to about 20% $Bi_2O_3$, a combined weight of up to about 20% $Nb_2O_5$, $La_2O_3$, $Y_2O_3$ and $CeO_2$, up to about 5% $ZrO_2$, up to about 20% CaO, up to about 5% MgO, up to about 2% $As_2O_3$ and a combined weight of up to about 3% $Li_2O$, $Na_2O$ and $K_2O$.

20 Claims, No Drawings

PORCELAIN ENAMEL COMPOSITION FOR ELECTRONIC APPLICATIONS

FIELD OF THE INVENTION

The invention concerns a new and improved porcelain enamel composition. More particularly, the invention concerns a porcelain enamel composition for use in forming a dielectric layer upon a section of metal to thereby form a substrate for use in electronic applications. The invention further provides a method of forming such electronic substrates.

BACKGROUND OF THE INVENTION

Porcelain enamel metal substrates for electronic applications and coating compositions for use in forming such substrates are well-known in the prior art. Examples of coating compositions for use in forming electronic substrates may be found, for example, in U.S. Pat. Nos. 4,256,796, 4,732,794 and 5,002,903.

Generally, porcelain enamel substrates are formed by applying the enamel composition to a section of metal, and then firing the metal to fuse the enamel composition to the metal. The enamel composition forms a substantially non-conductive or dielectric layer upon which electronic circuits can be formed. Such circuits are generally formed by applying (printing) conductive and/or resistive thick films or ink in a desired pattern upon the dielectric layer. The printed substrate is then fired at elevated temperatures to fuse the thick film or ink and form the desired electronic component. Firing generally requires temperatures of from about 550° C. to about 950° C.

Unfortunately, some prior art porcelain enamel compositions are not suitable for specific applications. More particularly, many prior art enamel compositions fail to provide an insulative or dielectric layer having leakage current properties suitable for applications where it is imperative that no meaningful amount of electric current leak through the dielectric layer to the underlying section of metal.

SUMMARY OF THE INVENTION

The present invention provides a new and improved porcelain enamel composition for use in forming an electronic substrate that is capable of displaying a leakage current to power ratio of less than about 1 mA/kw at 300° C. at 10 mils in thickness. In addition to exhibiting good leakage current properties the enamel composition displays excellent adhesion, a uniform surface finish and good stability upon being subjected to secondary heating and firing operations. Electronic substrates made in accordance with the present invention are useful in producing electronic circuit boards and other electronic devices.

In a preferred embodiment the enamel composition comprises a glass composition. The glass composition comprises in weight percent a combined weight of BaO and SrO of from about 15% to about 75%, from about 5% to about 35% $B_2O_3$, from about 10% to about 40% $SiO_2$, up to about 10% $Al_2O_3$, up to about 7% $Co_3O_4$, up to about 20% ZnO, up to about 20% $TiO_2$, up to about 7% $P_2O_5$, up to about 7% CuO, up to about 7% iron oxide such as $Fe_2O_3$, up to about 7% NiO, a combined weight of SnO, $MoO_3$, $WO_3$, $Sb_2O_3$, of up to about 20%, up to about 20% $Bi_2O_3$, a combined weight of up to about 20% $Nb_2O_5$, $La_2O_3$, $Y_2O_3$ and $CeO_2$, up to about 5% $ZrO_2$, up to about 20% CaO, up to about 5% MgO, up to about 2% $As_2O_3$ and a combined weight of up to about 3% $Li_2O$, $Na_2O$ and $K_2O$.

In addition to the enamel composition, the invention further provides a method of forming an electronic substrate.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION

The porcelain enamel composition of the present invention comprises a glass composition. The glass composition is formed in a conventional manner using melting techniques that are well-known to those skilled in the art. Generally, such melting techniques include heating the necessary raw materials or components to a temperature of from about 1350° C. to about 1400° C. so as to form a homogeneous glass melt. The glass melt is then converted to a glass frit by pouring the molten material over water chilled rollers so as to quickly solidify the glass. The solidified glass is then crushed and milled to the desired particle size. Multiple grindings in mediums such as water or alcohol may also be employed.

The glass composition which may be formed from one or multiple separate glass frits displays the following overall composition:

| Components | % By Weight | Preferred |
|---|---|---|
| BaO + SrO | 15–75 | 20–70 |
| $B_2O_3$ | 5–35 | 8–32 |
| $SiO_2$ | 10–40 | 12–25 |
| $Al_2O_3$ | 0–10 | 0–8 |
| $Co_3O_4$ | 0–7 | 0–5 |
| ZnO | 0–20 | 0–20 |
| $TiO_2$ | 0–20 | 0–20 |
| $P_2O_5$ | 0–7 | 0–5 |
| CuO | 0–7 | 0–5 |
| $Fe_2O_3$ | 0–7 | 0–5 |
| NiO | 0–7 | 0–5 |
| $SnO + MoO_3 + WO_3 + Sb_2O_5$ | 0–20 | 0–15 |
| $Bi_2O_3$ | 0–20 | 0–20 |
| $Nb_2O_5 + La_2O_3 + Y_2O_3 + CeO_2$ | 0–20 | 0–18 |
| $ZrO_2$ | 0–5 | 0–4 |
| CaO | 0–20 | 0–18 |
| MgO | 0–5 | 0–3 |
| $As_2O_3$ | 0–2 | 0–1 |
| $Li_2O + Na_2O + K_2O$ | 0–3 | 0–2 |
| F | 0–7 | 0–5 |

As can be seen by reviewing the above compositions, BaO and SrO may be used by themselves or in combination. In certain applications, it may be desirable to restrict the level of BaO contained in the enamel composition. In applications wherein acid resistance is of concern, it may be desirable to include a combined level of $Nb_2O_5$, $La_2O_5$, $Y_2O_3$ and $CeO_2$ of up to about 20%. Where an increased flow is required, it may be desirable to include a combined level of $MoO_3$, $WO_3$, $Sb_2O_5$ and SnO of up to about 15%. Preferably, the levels of MgO and CaO are restricted in order to help ensure proper flow and fusion of the enamel.

The enamel compositions of the present invention may be used in conjunction with various sections or pieces of metal to form the base or the mechanical support for the substrate. Such metals include, for example, stainless steel, aluminum, copper, etc. However, the enamel composition of the present invention is especially well suited for use with the low carbon steels that are commonly employed in porcelain enameling operations. The enamel composition may be applied to clean (degreased) low carbon steel without the need for special pretreatments such as chemical etching or pickling operations.

The enamel composition of the present invention may be applied using various techniques that are well-known in the art, such as, for example, dry electrostatic application, wet electrostatic spraying, wet dipping and electrophoretic deposition. However, dry electrostatic spraying is generally preferred.

Whether applied by the wet or dry process, the coating composition of the present invention may be applied directly or indirectly to the metal substrate. Indirect application would involve the primary or initial application of a ground coat or bonding coat. In certain applications, the use of a conventional ground coat material is preferred. An example of such a ground coat is a ground coat designed for electrostatic application which is sold by Ferro (Holland) B.V. of Holland under the trade designation 076-08-9892.

Depending upon the desired application technique, the enamel composition is formed by mixing the glass composition with one or more additives or mill additions. Of course, it will be appreciated that the mill additions will vary depending upon the specific application technique that is employed. As is well-known in the enamel art, there is a wide range of acceptable mill agents or components that may be utilized in the present invention. Examples of such mill additions, include silica, bentonite, coloring oxides, quartz, magnesium carbonate, potassium nitrate, clay, feldspars, polyorganosiloxanes, etc., the specific additions being a function of the particular final application (e.g., dry application, wet application, desired color or finish, etc.).

After application of the enamel composition, the coated metal is subjected to a firing operation. Firing may be conducted in a conventional manner. Firing generally is carried out at a temperature of from about 500° C. to about 900° C. Where a low carbon steel core is employed, an optimum firing schedule is for about 3 to about 20 minutes at a temperature of from about 700° C. to about 900° C.

Upon firing, the enamel composition displays a leakage current to power ratio of less than 1 mA/kw at 300° C. 10 mils in thickness. Also, upon firing the enamel generally contains at least about 3% by volume crystallized $2XO \cdot Al_2O_3 \cdot 2SiO_2$ wherein X comprises Ba or Sr. This crystallization product displays a relatively low coefficient of expansion thereby facilitating its use with conventional enamels and ground coats.

It will be appreciated that depending up the specific application, opacifiers such as $TiO$, $ZrO_2$ and $CeO_2$ may be added to the milling or the glass composition so as to impart a desired color or look to the enamel.

By way of illustration and not by any limitation, the following examples will describe specific compositions within the scope of the present invention. Unless otherwise indicated, all parts and percentages are by weight.

EXAMPLE I

The following glass compositions were prepared:

| Component | Parts By Weight | | | |
|---|---|---|---|---|
| | A | B | C | D |
| F | 3.71 | — | — | — |
| SrO | — | — | 33.09 | 23.84 |
| BaO | 59.32 | 53.49 | — | — |
| $Al_2O_3$ | 9.13 | — | 1.19 | — |
| $SiO_2$ | 31.14 | 13.97 | 22.28 | 15.89 |
| $B_2O_3$ | — | 24.28 | 23.29 | 23.84 |
| $TiO_2$ | — | 8.26 | 18.68 | 19.87 |
| $CO_3O_4$ | 0.41 | — | 0.16 | 0.66 |
| ZnO | — | — | — | 15.90 |
| $P_2O_5$ | — | — | 1.32 | — |

The compositions A–D were milled in dry powder form to provide a median particle size of about 20 μm.

EXAMPLE II

Enamel compositions 1–3 were formed by mixing together the following:

| | Parts By Weight | | |
|---|---|---|---|
| | 1 | 2 | 3 |
| Glass A | 55 | — | — |
| Glass B | 45 | — | — |
| Glass C | — | 75 | 50 |
| Glass D | — | 25 | 50 |
| Methylhydrogen Polysiloxane | 0.20 | 0.29 | 0.20 |

*Milling Fineness - 14–18% by weight retained on a 325 mesh screen.

EXAMPLE III 5.5"×5.5"×0.036" thick sections of low carbon steel were electrostatically sprayed with conventional ground coat material available from Ferro (Holland) B.V. of Holland, under the trade designation 076-08-9892 and fired for about 3.5 minutes at about 1540° F. so as to provide about 8.5 grams of material at a thickness of about 4 mils. Enamel compositions 1-3 were then applied to provide about 10 grams of such material on the panels and then fired at about 1520° F. for about 3.5 minutes. This was done twice to achieve approximately 8 mils of fired thickness for the enamel compositions. The resultant substrates displayed the following properties:

| Enamel Composition Employed | Current To Power Ratio At 300° C. (AC) |
|---|---|
| 1. Composition 1 | 0.04 mA/kW |
| 2. Composition 2 | 0.09 mA/kW |
| 3. Composition 3 | 0.12 mA/kW |

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

What is claimed:

1. A coating composition for use in forming a dielectric coating layer upon firing comprising a glass composition, said glass composition comprising in weight percent a combined weight of BaO and SrO of from about 15% to about 75%, from about 5% to about 35% $B_2O_3$, from about 10% to about 40% $SiO_2$, up to about 10% $Al_2O_3$, up to about 7% $Co_3O_4$, up to about 20% ZnO, up to about 20% $TiO_2$, up to about 7% $P_2O_5$, up to about 7% CuO, up to about 7% $Fe_2O_3$, up to about 7% NiO, a combined weight of SnO, $MoO_3$, $WO_3$, $Sb_2O_3$, of up to about 20%, up to about 20% $Bi_2O_3$, a combined weight of up to about 20% $Nb_2O_5$, $La_2O_5$, $Y_2O_3$ and $CeO_2$, up to about 5% $ZrO_2$, up to about 20% CaO, up to about 5% MgO, up to about 2% $As_2O_3$ and a combined weight of up to about 3% $Li_2O$, $Na_2O$ and $K_2O$.

2. A coating composition as set forth in claim 1 wherein said glass composition in weight percent comprises from about 20% to about 70% BaO and SrO, from about 8% to about 32% $B_2O_3$, from about 12% to about 25% $SiO_2$, up to about 8% $Al_2O_3$, up to about 5% $Co_3O_4$, up to about 20% $TiO_2$, up to about 20% ZnO, up to about 5% $P_2O_5$, up to about 5% CuO, up to about 5% $Fe_2O_3$, up to about 5% NiO, up to about 15% SnO, $MoO_3$, $WO_3$ and $Sb_2O_5$, up to about 20% $Bi_2O_3$, up to about 18% $Nb_2O_5$, $La_2O_3$, $Y_2O_3$ and $CeO_2$, up to about 4% $ZrO_2$, up to about 18% CaO, up to about 3% MgO, up to about 1% $As_2O_3$, up to about 2% $Li_2O$, $Na_2O$ and $K_2O$.

3. An electronic substrate comprising a section of metal, said section of metal having deposited thereon a dielectric layer formed by firing a composition comprising a glass composition, said glass composition comprising in weight percent a combined weight of BaO and SrO of from about 15% to about 75%, from about 5% to about 35% $B_2O_3$, from about 10% to about 40% $SiO_2$, up to about 10% $Al_2O_3$, up to about 7% $Co_3O_4$, up to about 20% ZnO, up to about 20% $TiO_2$, up to about 7% $P_2O_5$, up to about 7% CuO, up to about 7% $Fe_2O_3$, up to about 7% NiO, a combined weight of SnO, $MoO_3$, $WO_3$, $Sb_2O_5$, of up to about 20%, up to about 20% $Bi_2O_3$, a combined weight of up to about 20% $Nb_2O_5$, $La_2O_3 Y_2O_3$ and $CeO_2$, up to about 5% $ZrO_2$, up to about 20% CaO, up to about 5% MgO, up to about 2% $As_2O_3$ and a combined weight of up to about 3% $Li_2O$, $Na_2O$ and $K_2O$.

4. A method of forming an electronic substrate comprising:

I. providing a coating composition as set forth in claim 1;

II. providing a section of metal;

III. applying said composition to said section of metal; and

IV. firing said section of metal so as to form a dielectric layer on said section of metal, said dielectric layer having a leakage current to power ratio of less than about 1 mA/kW at 300° C. and a thickness of 10 mils.

5. A method as set forth in claim 4 wherein said section of metal comprises low carbon steel.

6. A method as set forth in claim 4 wherein during said application step III, said composition is electrostatically applied to said section of metal.

7. A method as set forth in claim 4 wherein said firing step IV is conducted at a temperature of from about 500° C. to about 900° C.

8. A coating composition as set forth in claim 1 wherein said glass composition comprises a blend of two or more glass frits.

9. A coating composition as set forth in claim 1 further comprising one or more mill additions selected from the group consisting of silica, bentonite, coloring oxides, quartz, magnesium carbonate, potassium nitrate, clay, feldspars, and polyorganosiloxanes.

10. An electronic substrate as set forth in claim 3 wherein upon firing, said dielectric layer comprises an enamel having at least 3% by volume crystallized $2XO.Al_2O_3.2SiO_2$, wherein X comprises Ba or Sr.

11. A method as set forth in claim 4 wherein said section of metal comprises stainless steel.

12. A method as set forth in claim 4 wherein said section of metal comprises aluminum.

13. A method as set forth in claim 4 wherein said section of metal comprises copper.

14. A method as set forth in claim 4 wherein a ground coat is applied to said section of metal prior to the application of said composition.

15. A method as set forth in claim 4 wherein during said application step III, said composition is applied by electrophoretic deposition to said section of metal.

16. A method as set forth in claim 4 wherein during said application step III, said composition is applied by wet dipping to said section of metal.

17. A method as set forth in claim 4 wherein said application step III and said firing step IV are repeated to increase the fired thickness of the electronic substrate.

18. A method as set forth in claim 6 wherein said composition is applied by dry electrostatic application.

19. A method as set forth in claim 6 wherein said composition is applied by wet electrostatic application.

20. A method as set forth in claim 7 wherein said section of metal comprises low carbon steel and said firing step IV is conducted at a temperature of from about 700° C. to about 900° C. for about 3 to about 20 minutes.

* * * * *